United States Patent [19]
David et al.

[11] Patent Number: 5,781,234
[45] Date of Patent: Jul. 14, 1998

[54] CHARGE-COUPLED IMAGE SENSOR OPERABLE TO SIMULTANEOUSLY TRANSFER PIXELS FROM ADJACENT IMAGE ACQUISITION AND IMAGE STORAGE AREAS AT DIFFERENT PIXEL TRANSFER RATES

[75] Inventors: Morgan William Amos David, Farnham; John William Richards, Stockbridge; Clive Henry Gillard, Basingstoke, all of England

[73] Assignee: Sony United Kingdom Limited, Weybridge, England

[21] Appl. No.: 956,085

[22] Filed: Oct. 2, 1992

[30] Foreign Application Priority Data

Dec. 9, 1991 [GB] United Kingdom ............... 49126117

[51] Int. Cl.$^6$ ............................................. H04N 5/335
[52] U.S. Cl. ............................................. 348/319
[58] Field of Search ............... 358/213.11, 213.22, 358/213.23, 213.25, 213.26, 213.29, 212, 41, 50; 348/294, 295, 297, 298, 311, 312, 316, 317, 318, 319, 322, 323, 324; H04N 5/335

[56] References Cited

U.S. PATENT DOCUMENTS 4,575,763  3/1986  Flabd ............................... 358/213.25
4,656,520  4/1987  Hurst ............................... 358/213.25
4,742,396  5/1988  Bell ................................. 355/213.2 X
4,839,734  6/1989  Takemura ......................... 358/213.22

FOREIGN PATENT DOCUMENTS 0 127 363  12/1984  European Pat. Off. ........ H01L 27/14
214065     11/1984  United Kingdom ............. H04N 3/15
2178232    2/1987   United Kingdom ............. H04N 31/00

*Primary Examiner*—Andrew I. Faile
*Assistant Examiner*—Tuan V. Ho
*Attorney, Agent, or Firm*—Frommer Lawrence & Haug LLP; William S. Frommer

[57] ABSTRACT

A charge-coupled image sensor having adjacent image acquisition and image storage areas is described. Pixel transfer can take place from the image acquisition area to the image storage area and from the image storage area to an output register simultaneously and at different respective transfer rates. This allows the image transfer into the storage area to begin during the active field period, i.e. while pixels are still being transferred from the storage area into the output register. In a preferred embodiment this is achieved by partitioning the image storage area into a first and a second storage section which can selectively operate at the same or different transfer clocking rates.

16 Claims, 10 Drawing Sheets

CHARGE-COUPLED IMAGE SENSOR OPERABLE TO SIMULTANEOUSLY TRANSFER PIXELS FROM ADJACENT IMAGE ACQUISITION AND IMAGE STORAGE AREAS AT DIFFERENT PIXEL TRANSFER RATES

BACKGROUND OF THE INVENTION

1. Field of the Invention

The present invention relates to charge-coupled image sensors.

2. Description of the Prior Art

Charge-coupled image sensors, often referred to as charge-coupled devices, are used in image sensing applications such as professional and domestic video cameras. The sensors comprise a semiconductor substrate having a large array of photosensitive image sensing elements which are capable of accumulating and storing electric charge in response to the level of incident light falling on the elements. The elements can also be made to transfer their accumulated charge to adjacent elements under the control of a suitable clocking signal, thus acting as an analogue shift register.

In operation, each image sensing element in a charge-coupled image sensor accumulates charge, in response to the level of incident light falling on that element, over a predetermined period. This period is usually the active field period in one field of an interlaced video signal. During the field blanking period the accumulated charges on the image sensing elements are quickly transferred to image storing elements which are masked from the incident light by means of an opaque layer covering these elements. The image sensing elements may be covered by a mechanical shutter during this transfer phase. At the end of the field blanking period all of the accumulated charges representing respective picture elements (pixels) in the image have been transferred to image storing elements, and the image sensing elements can begin to accumulate charge once again. The charges stored by the image storing elements are then converted into a serial output from the sensor; this output may be an analogue video signal or a digital data stream representing successive pixels in the image.

In one known type of charge-coupled image sensor, the frame transfer type, a rectangular array of image sensing elements (generally one per pixel) is fabricated next (in a vertical image direction) to a similar rectangular array of image storing elements. The accumulated charges representing respective pixels are transferred during field blanking from the array of image sensing elements into corresponding positions in the array of image storing elements. Because the two arrays are vertically adjacent, each of the accumulated charges has to pass through a large number of elements (dependent on the picture height in pixels) during the field blanking period in order to reach a corresponding position in the image storage array. During the next active field period the charges stored in the image storage array are supplied, line-by-line in parallel, to a horizontal output analogue shift register from which they are shifted out serially to an output amplifier at the sensor's output.

The field blanking period is much shorter than the active field period, so the vertical shifting of accumulated charges during the field blanking period will be at a much higher rate than that of the steady vertical shift from the image storage area to the horizontal output register.

It is important that the accumulated charges are all transferred from the image sensing elements to their respective storage elements in a period no longer than the field blanking period. One reason for this is that depending on the position of an image sensing element within the image sensing array, the charge from that element will usually have to pass through several other image sensing elements to reach the storage area. These other image sensing elements may be covered by a shutter during the field blanking period, but will be exposed to incident light again during the next active field period. If the image transfer were not complete by the start of the next active field period then those pixels for which the corresponding accumulated charge was still held by an image sensing element could be corrupted.

The above discussion imposes a lower limit on the vertical transfer rate from the image sensing array to the image storage array, in that the transfer must be completed within the field blanking period. There are also practical upper limits on the rate of vertical shifting. One of these stems from the fact that an increase in the shifting rate generally causes an increase in the power dissipated by the sensor. This in turn will raise the temperature of the sensor and so increase the thermal background noise level of the sensor (by about a factor of two for a rise in temperature of ten degrees Celsius). An increase in the vertical transfer rate can also cause other problems associated with the charge transfer itself. In order to transfer an accumulated charge accurately through a large number of elements it is important that the transfer clocking waveforms are precisely controlled. The capacitative loading for vertical transfer clocking signals in known charge-coupled image sensors is very high, so the clock waveforms can be badly impaired if the clocking speed is increased by too much. This can result in pronounced visual impairments, such as fixed pattern noise, in the image being sensed by the charge-coupled sensor.

The problems described above are likely to be much more prevalent in charge-coupled sensors used for producing high definition television (HDTV) images. In a high definition image there are generally about twice as many lines in each active field and about two to three times as many pixels in each active line as conventional definition television. For example, the present television transmission standard in the United Kingdom has 287.5 lines per active field, whereas a proposed high definition television standard has 517 lines in an active field. As a result, the accumulated charges will have to be transferred through a larger number of elements during the field blanking period. Also, the field frequency may be higher in a high definition standard in order to reduce the perceived flicker of the image. This will tend to reduce the field blanking period in a high definition television standard compared to that in a conventional definition standard. When applied to known charge-coupled image sensors, these factors contribute towards a requirement for an ever higher rate of vertical charge transfer between the image sensing elements and the image storing elements in a charge-coupled image sensor. As described above, however, this requirement conflicts with the parallel requirement for low-noise operation of the sensors.

SUMMARY OF THE INVENTION

It is an object of the invention to provide a charge-coupled image sensor which solves, or at least alleviates, the problems described above.

This invention provides a charge-coupled image sensor comprising:

(I) an image acquisition area comprising an array of photosensitive pixel-storing elements;

(II) an image storage area adjacent to said image acquisition area, said image storage area comprising an array of pixel-storing elements;

(III) an output register;

(IV) a first transfer means for transferring stored pixels from said image acquisition area to said image storage area; and (V) a second transfer means for transferring stored pixels from said image storage area to said output register;

wherein said first transfer means and said second transfer means are operable simultaneously at different rates of pixel transfer.

The invention solves the problem that known charge-coupled image sensors have been restricted to performing the fast vertical transfer between the image acquisition and image storage areas during image blanking periods. As the spatial definition and the field frequency of television standards increase as new standards such as HDTV are defined, the available time for vertical shifting during these blanking periods becomes correspondingly less. By allowing the transfer into the storage area to take place simultaneously with the transfer out of the storage area, but at a different transfer rate, the fast vertical shift can be allowed to start before the end of the period during which the sensor is supplying an output video signal.

In a preferred configuration the image storage area comprises a first storage section to which pixels can be transferred from the image acquisition area, a second storage section from which pixels can be transferred to the output register, and a third transfer means for transferring stored pixels from the first storage section to the second storage section.

The invention is applicable to sensors whose output is in parallel form, but in a preferred embodiment the pixels stored in the output register are read out serially to form a periodic output video signal having a predefined field period, the field period comprising an active field period and a field blanking period. In such an embodiment it is preferred that the second transfer means is operative to transfer pixels from the second storage portion to the output register during the active field period of the output video signal; the first transfer means is operative to transfer pixels from the image acquisition area to the first storage portion during an image transfer period which includes the field blanking period of the output video signal; and the third transfer means is operative to transfer pixels from the first storage portion to the second storage portion between the start of the field blanking period of the output video signal and the start of the image transfer period.

In the case of a non-interlaced video signal, reference to the field period should be understood to mean the frame period of the video signal.

It is preferred that the image acquisition area and the image storage area each comprise a plurality of lines of pixel-storing elements, and that the first, second and third transfer means are each operable to transfer a line of stored pixels in parallel.

In a preferred embodiment the number of lines of pixel-storing elements in the image storage area is equal to the number of lines of photosensitive pixel-storing elements in the image acquisition area and the number of pixel-storing elements in each line of the image storage area is equal to the number of photosensitive pixel-storing elements in each line of the image acquisition area.

The invention is particularly useful when included in a video camera comprising one or more charge-coupled image sensors as set out above.

Viewed from a second aspect this invention provides a method of operation of a charge-coupled image sensor, said charge-coupled image sensor having an image acquisition area comprising an array of photosensitive pixel-storing elements; an image storage area adjacent to said image acquisition area, said image storage area comprising an array of pixel-storing elements; and an output register; said method comprising the steps of:

(I) exposing said image acquisition area to incident light, thereby storing pixels in said image acquisition area;

(II) transferring said stored pixels from said image acquisition area to said image storage area at a first transfer rate for a first predefined period; and (III) transferring said stored pixels from said image storage area to said output register at a second transfer rate for a second predefined period;

wherein said first predefined period and said second predefined period at least partially overlap and said first transfer rate and said second transfer rate are different.

It is preferred that the method further comprises the step of serially reading pixels stored in the output register to form a periodic output video signal having a predefined field period, the field period comprising an active field period and a field blanking period. In such a case it is preferred that the first predefined period includes the field blanking period of the output video signal; and the second predefined period is the active field period of the output video signal.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
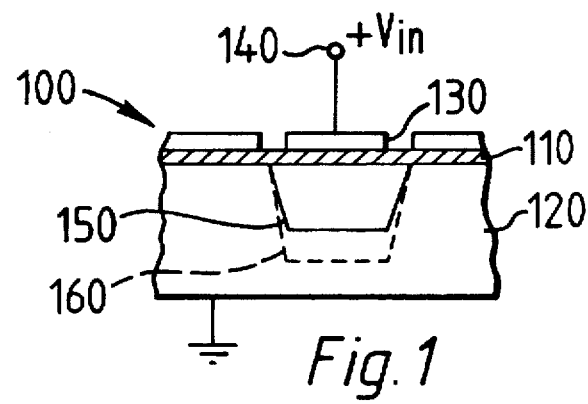
FIG. 1 is a schematic illustration of a single charge-storing element for use in a charge-coupled image sensor.

Referring now to FIG. 1, a charge-storing element 100 for use in a charge-coupled image sensor comprises a metal oxide semiconductor (MOS) structure. In this structure an oxide layer 110 is fabricated on a semiconductor substrate 120. A number of electrodes 130, one per element, are fabricated on the oxide layer 110. Each of the electrodes 130 is supplied with a control voltage by means of a respective input terminal 140.

When the control voltage applied at the terminal 140 is zero, the semiconductor substrate 120 beneath the input terminal will contain a substantially uniform distribution of positive charge carriers (holes) and negative charge carriers (electrons). However when a positive voltage ($+V_{in}$) is applied to the terminal 140 then the free positive charge carriers (holes) will be repelled away from the electrode 130 and a depletion layer 150 will be formed beneath the electrode. Increasing the voltage at the terminal 140 to a higher positive voltage with respect to the substrate will cause a correspondingly larger depletion layer 160 (shown in broken line on the diagram) to be formed.

The elements 100 as shown in FIG. 1 can be used as image sensing elements or as image storing elements. The basic difference between the two types of element is that the image sensing elements are exposed to incident light whereas the image storing elements are covered by an opaque layer to avoid corruption of the stored image.

When an element 100 is exposed to light, photogenerated hole-electron pairs will be formed in the semiconductor substrate 120. If there is no potential difference between the electrode 130 and the semiconductor substrate 120, and therefore no depletion layer 150 is present, the hole-electron pairs will simply recombine soon after they are formed. However, if a depletion layer 150 is in fact present when a hole-electron pair is formed, the hole will be repelled from the electrode 130 out of the depletion layer, and the electron will be attracted towards the electrode 130. The electron will not recombine with a hole because there are no free holes in the depletion layer. Furthermore, the electrons are insulated from the electrode 130 by the oxide layer 110.

Because the electron in the depletion layer 150 is not able to recombine with a hole, it is effectively stored at the element 100. This illustrates the basic charge-storing property of these elements.

Figure 2:
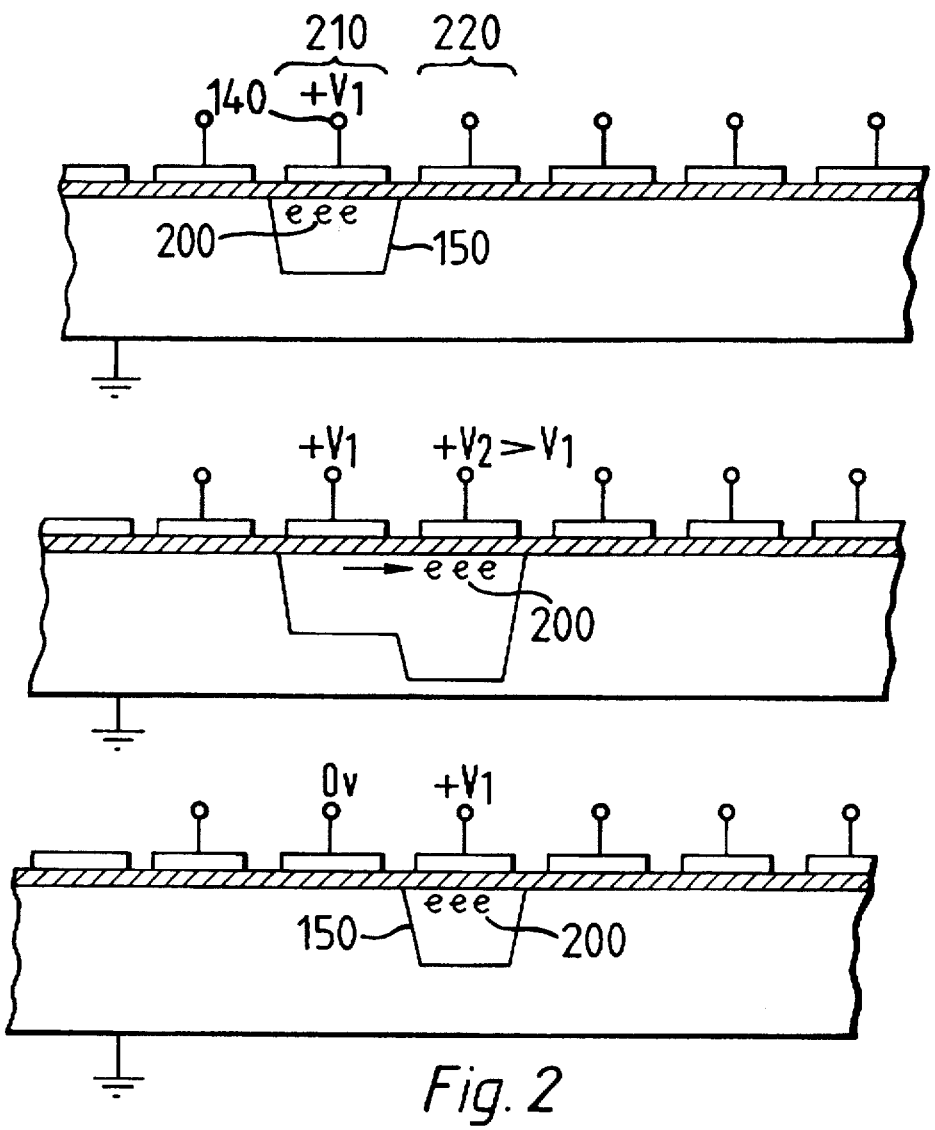
FIG. 2 schematically illustrates charge transfer between adjacent charge-storing elements in a charge-coupled image sensor.

FIG. 2 is a schematic illustration of the mechanism by which charge can be transferred between adjacent elements in a charge-coupled image sensor. In the diagram, three stages in the transfer of a number of photogenerated electrons 200 from a first element 210 to a second element 220 are shown.

In the first stage of operation (shown at the top of the Figure) the photogenerated electrons 200 are shown as being stored in the depletion layer 150 of the first element 210 which is formed by the application of a positive control voltage ($+V_1$) to the input terminal 140 of the first element 210. The second stage of operation shows a higher positive control voltage ($+V_2$) being applied to the input terminal 140 of the second element 220. One effect of this higher control voltage is that a larger depletion layer is formed at the second element. The depletion layers formed at the first and second elements merge into one another and the photogenerated electrons 200 are able to move to the higher positive potential ($+V_2$) on the electrode of the second element 220 (to which they are electrically attracted) without encountering any free holes on the way.

The final stage of operation is that the control voltage on the input terminal of the first element 210 can be reduced to zero and the voltage on the input terminal of the second element 220 can be reduced to $+V_1$. The photogenerated electrons 200 are now confined in the depletion layer 150 of the second element 220.

A charge-coupled image sensor typically comprises a very large number of elements 100. Each actual image sensing or image storing element may also have one or more associated adjacent elements to facilitate the image transfer. To achieve charge transfer along rows or columns of the elements, it is usual to connect the input terminals 140 of every second or third electrode together and to drive the electrodes with a suitable two-or-three-phase clocking signal. Certain types of charge-coupled image sensors will now be described. It will be assumed that the sensors are arranged so as to produce an interlaced output video signal having a predefined field period. The field period consists of two discrete, non-overlapping periods, namely the active field period and the field blanking period. Lines of video information are communicated during the active field period, and synchronising and other information is communicated during the field blanking period. The field blanking period is predefined to allow certain pieces of video equipment such as cameras and monitors employing a scanning electron beam sufficient time to perform vertical fly-back of the electron beam.

Figure 3:
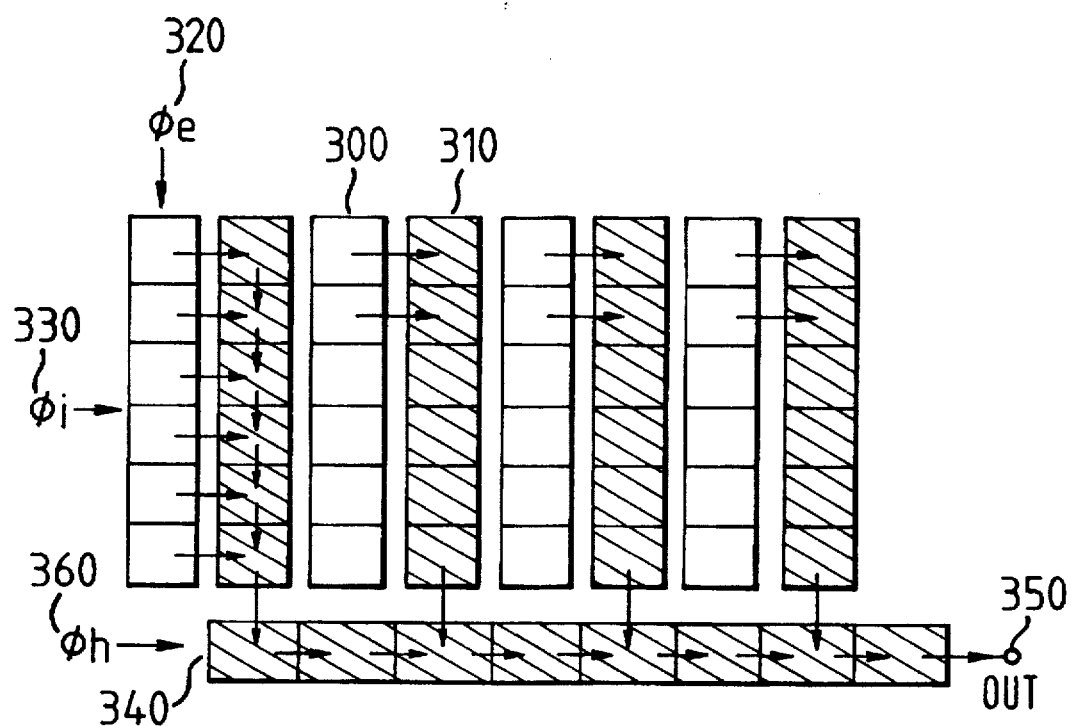
FIG. 3 schematically illustrates an interline transfer charge-coupled image sensor.

FIG. 3 illustrates one known type of charge-coupled image sensor, to be referred to as an interline transfer sensor. In common with the other sensors to be described below, this sensor comprises a large number of individual elements 100 as described above with reference to FIG. 1. In the interline transfer sensor the elements are arranged in alternating columns of image sensing elements 300 and image storing elements 310. The fact that the image storing elements are masked from the incident light is shown schematically in FIG. 3 by those elements being shaded.

In operation the image sensing elements are exposed to incident light for a predefined period, such as the field period in a video signal. At the end of this period the charge stored in each of the image sensing elements 300 is transferred, under the control of an interline transfer clocking signal ($\Phi_e$) 320, to a respective one of the image storing elements 310 horizontally adjacent to that image sensing element 300. During the next active field period in the video signal the charges stored in the columns of image storing elements 310 are transferred under the control of an image area clocking signal ($\Phi_i$) 330 down their respective columns to a horizontal output register 340. If an interlaced video signal is being generated then the charges transferred to the horizontal output register 340 may be the average of two vertically adjacent elements, or may correspond to alternate elements in a vertical direction. The horizontal output register 340 comprises a row of similar charge-storing elements and operates to transfer the stored charges horizontally to an output terminal 350 under the control of an output register clocking signal ($\Phi_h$) 360. In this way, the essentially parallel data supplied by the columns of image storing elements 310 is converted into a serial output signal by the horizontal output register 340. An output amplifier (not shown) may be used to convert the stored charges presented at the output terminal 350 to a suitable output voltage. Alternatively the output of the sensor can be digitised for subsequent transmission and processing.

The interline transfer sensor suffers from the disadvantage that in practice it is difficult to achieve good isolation between the adjacent columns of image sensing elements 300 and image storing elements 310. One effect of this is that the sensor can suffer from "leakage" between the image sensing elements and the image storing elements as the stored charges progress down the columns of image storing elements 310. This problem is avoided by a further type of known charge-coupled image sensor to be discussed below, namely the frame-interline transfer sensor.

Figure 4:
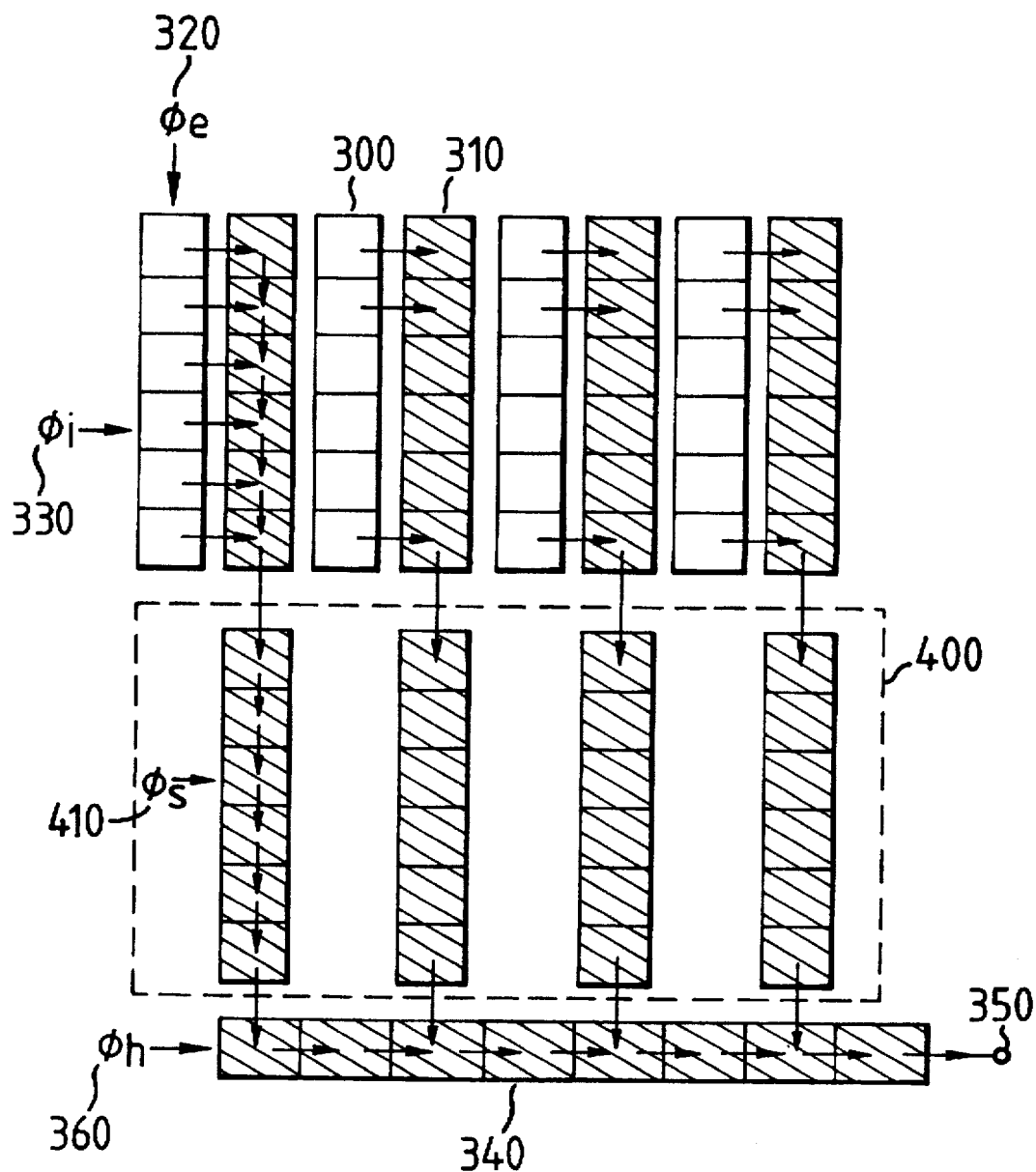
FIG. 4 schematically illustrates a frame-interline transfer charge-coupled image sensor.

FIG. 4 is a schematic illustration of a frame-interline transfer charge-coupled sensor. This type of sensor is similar to the interline transfer sensor described above with reference to FIG. 3 in that it comprises interspersed rows of image sensing elements 300 and image storing elements 310. At the end of the charge accumulation period the charges stored in vertically alternate ones of the image sensing elements 300 are transferred to horizontally adjacent image storing elements 310 under the control of an interline transfer clocking signal ($\Phi_e$) 320. However, the next phase of operation is different to that of the interline transfer sensor described above. Under the control of an image area clocking signal ($\Phi_i$) 330 the charges stored in the columns of image storing elements 310 are transferred during the vertical blanking period to a masked storage area 400 comprising a number of columns of charge-storing elements. Once the charges have been transferred to the masked storage area there is no danger of their being affected by leakage from adjacent image sensing elements. During the next active field period the charges are steadily transferred down through the columns of elements in the masked storage area 400 under the control of a storage area clocking signal ($\Phi_s$) 410 into a horizontal output register 340 similar to the one used in the interline transfer sensor. As before, the charges are transferred horizontally through the horizontal output register 340 to an output terminal 350 under the control of an output register clocking signal ($\Phi_h$) 360.

In the frame-interline sensor the number of elements in the vertical direction in the masked storage area 400 is one half of the number of elements in each column of image sensing elements 300. This is because during each field of the output video signal the masked storage area 400 stores charges accumulated by vertically alternate ones of the image sensing elements.

Figure 5:
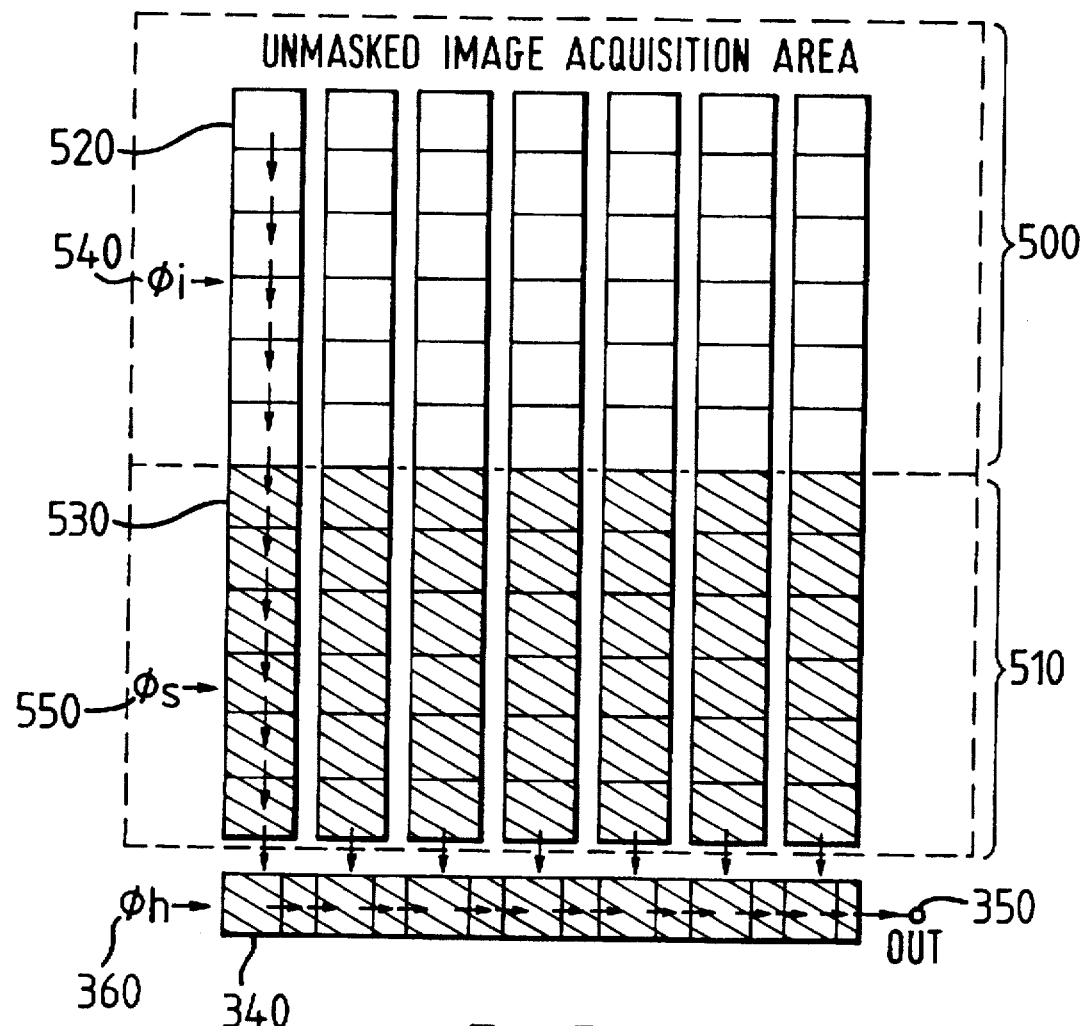
FIG. 5 schematically illustrates a frame transfer charge-coupled image sensor.

FIG. 5 is a schematic illustration of a frame transfer charge-coupled sensor which comprises an unmasked image acquisition area 500, a masked storage area 510, and a horizontal output register 340. In the frame transfer sensor charges are accumulated by image sensing elements 520 in the unmasked image acquisition area 500 during a predefined period such as the active field period in a video signal. During field blanking, the stored charges are quickly transferred from image sensing elements 520 in the unmasked acquisition area, along the columns of image sensing elements, to corresponding image storing elements 530 in the masked storage area 510. The number of image storing elements 530 in the masked storage area 510 is equal to the number of image sensing elements 520 in the unmasked image acquisition area 500. The charge transfer through the image sensing elements is under the control of an image area clocking signal ($\Phi_i$) 540 and the charge transfer through the storage area is under the control of a storage area clocking signal ($\Phi_s$) 550. During the next active field period the stored charges held in the image storing elements 530 in the masked storage area 510 are transferred steadily downwards along the columns of image storing elements 530 to a horizontal output register 340. The charges presented to the horizontal output register 340 can represent the average of the charges accumulated by two vertically adjacent elements. Alternatively, alternate charges in a vertical direction can be discarded to provide an interlaced output video signal. Charges held in the horizontal output register 340 are transferred to the output terminal 350 as described above under the control of an output register clocking signal ($\Phi_h$) 360.

Figure 6:
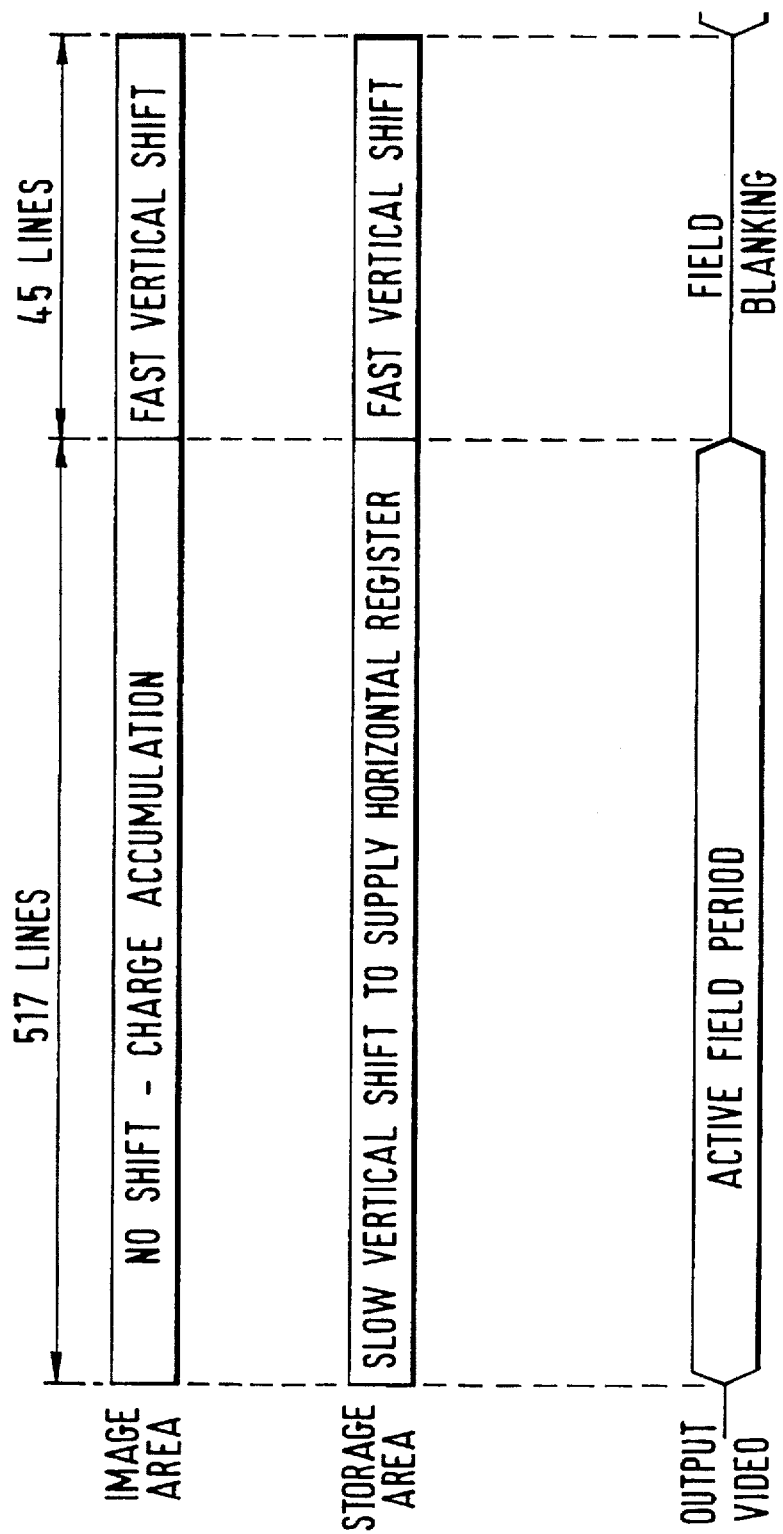
FIG. 6 is a timing diagram showing operation of the frame transfer charge-coupled image sensor of FIG. 5 during a single field period.

FIG. 6 is a timing diagram showing the operation of the frame transfer charge-coupled sensor of FIG. 5 during a single field period. The field period comprises two portions, the active field period and the vertical or field blanking period. In FIG. 6 the periods appropriate for high definition television are illustrated, in that the active field period is specified as comprising 517 lines and the field blanking period is specified as lasting for 45 lines.

During the active field period the unmasked image acquisition area is simply accumulating charge at each image sensing element 520 in response to the intensity of the light incident on that element. At the same time the charges stored in the masked storage area 510 are being slowly shifted vertically down the columns of image storing elements 530, under the control of the storage area clocking signal ($\Phi_s$) 550 to supply the horizontal output register 340. At any time the charges held in the horizontal output register 340 represent pixels from a single line in the image, so it follows that the horizontal output register 340 must be refreshed by a new row of charges from the image storing elements 530 at the line repetition frequency. During the whole of the active field period the horizontal output register 340 supplies image information to the output terminal 350.

During the field blanking period, which is considerably shorter than the active field period, a fast vertical shifting takes place in both the unmasked image acquisition area 500 and the masked storage area 510. The respective clocking signals for these areas ($\Phi_i$ 540 and $\Phi_s$ 550) operate in unison so that when a charge reaches the bottom of one of the columns in the unmasked image acquisition area 500 it is transferred directly to the top of a corresponding column in the masked storage area 510 and continues its transfer down that column. During this period no charges are transferred to the horizontal output register 340. The vertical charge transfer during the field blanking period is necessarily fast because each charge has to pass through a large number of elements, the number being dependent upon the vertical height of the image in pixels.

In the known charge-coupled sensors described above with reference to FIGS. 4, 5 and 6 the internal operation of the sensors is divided in time into two discrete periods corresponding to the active field period and the field blanking period. In one period (the active field period) pixels are slowly supplied to the output terminal 350. In the other period (the field blanking period) a fast vertical shift takes place between the image acquisition elements and the image storing elements. These two periods do not overlap.

Figure 7:
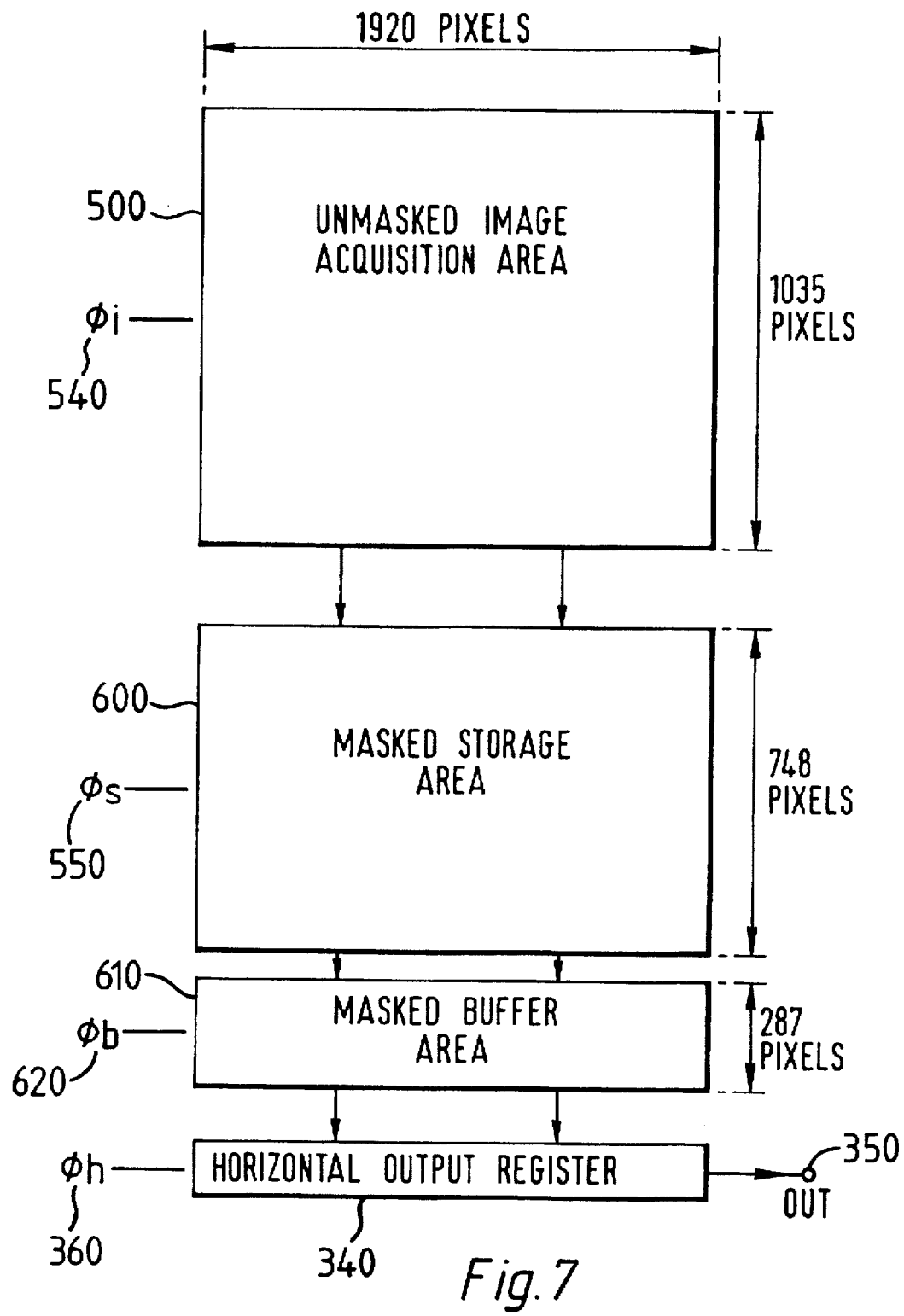
FIG. 7 schematically illustrates a frame transfer charge-coupled image sensor according to a first embodiment of the invention.

FIG. 7 shows a frame transfer charge-coupled image sensor according to one embodiment of the present invention. In this Figure the individual elements are not shown, but instead the overall architecture or structure of the sensor is shown schematically. In some respects the frame transfer sensor in FIG. 7 is similar to that shown in FIG. 5. For example the sensor in FIG. 7 has an unmasked image acquisition area 500 comprising a number of columns of image sensing elements under the control of an image area clocking signal ($\Phi_i$) 540. However in FIG. 7 the storage area is partitioned into a masked storage area 600 and a masked buffer area 610. Both of the masked storage area 600 and the masked buffer area 610 have the same number of horizontal pixels as the unmasked image acquisition area 500. The sum of the number of pixels in the vertical direction in the masked storage area 600 and in the masked buffer area 610 equals the number of pixels in the vertical direction in the unmasked image acquisition area 500. The masked storage area is under the control of a storage area clocking signal ($\Phi_s$) 555 and the masked buffer area is under the control of a buffer area clocking signal ($\Phi_b$) 620. The areas are arranged so that charges stored in the unmasked image acquisition area 500 can be transferred into the masked storage area and from there into the masked buffer area. The charges may then be transferred under the control of the buffer area clock signal ($\Phi_b$) 620 to a horizontal output register 340 which supplies the charges serially to an output terminal 350 under the control of an output register clocking signal ($\Phi_h$) 360 as described earlier. The operation of the frame transfer sensor shown in FIG. 7 will become apparent in the following description with reference to FIGS. 8 and 9.

Figure 8:
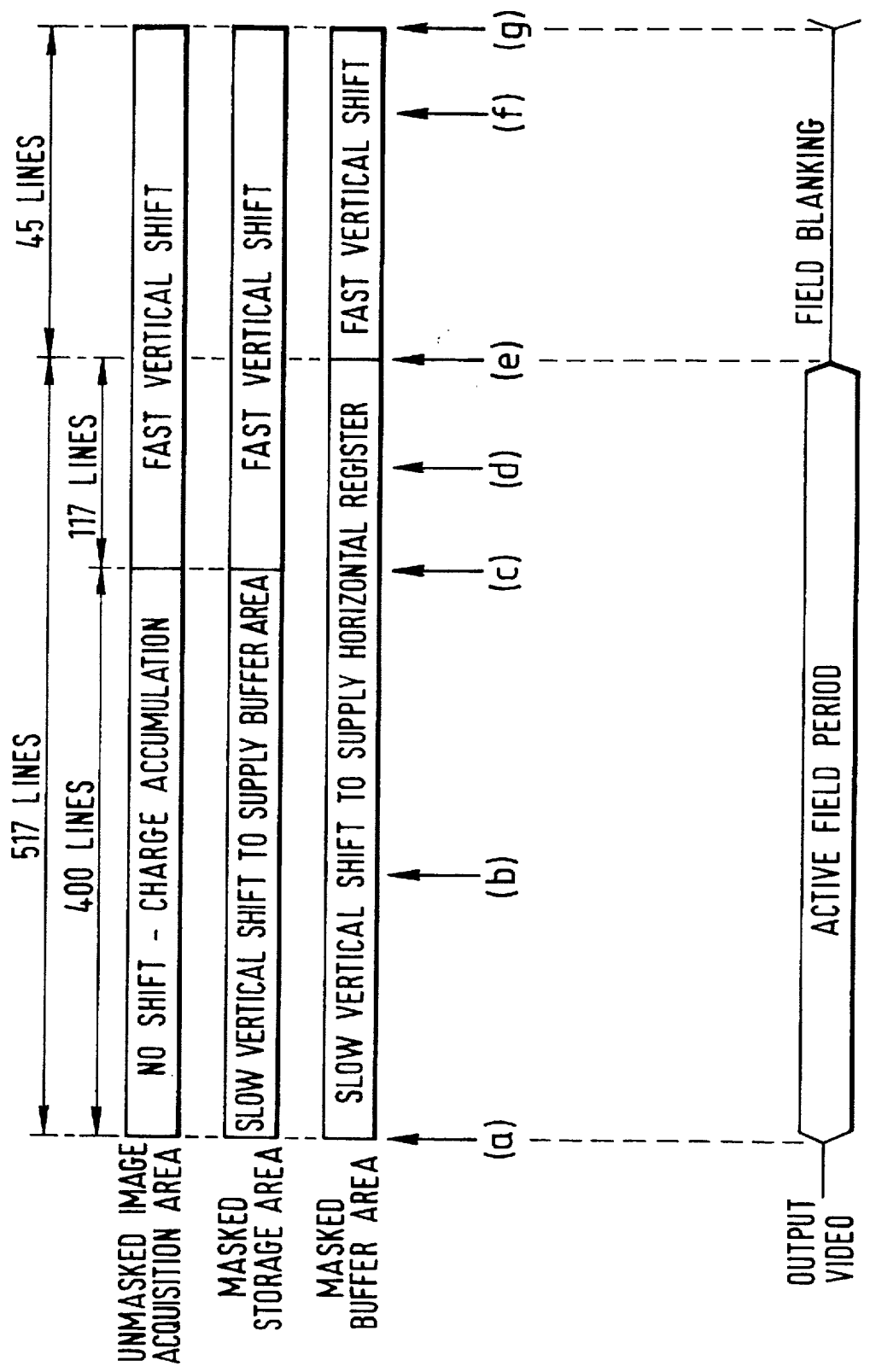
FIG. 8 is a timing diagram showing operation of the frame transfer charge-coupled image sensor of FIG. 7 during a single field period.

FIG. 8 is a timing diagram showing operation of the frame transfer sensor shown in FIG. 7 during a single field period. The timing diagram shows the status of the unmasked image acquisition area 500, the masked storage area 600, the masked buffer area 610, and the video output supplied at the output terminal 350. As in FIG. 6 described earlier, time is represented along the horizontal axis of the Figure (although not to scale). At various points along the time axis a vertical arrow is marked with a corresponding letter from (a) to (g). The states of the three areas (the unmasked image acquisition area, the masked storage area, and the masked buffer area) at the marked points (a) to (g) in the field period are shown schematically in FIGS. 9(a) to (g) respectively.

The point (a) represents the start of the field period. The elements in the unmasked image acquisition area 500 start to accumulate charge in response to the light intensity incident on those elements. All of the charge-storing elements in the masked storage area 600 and the masked buffer area 610 are holding charges accumulated in the unmasked image acquisition area during the previous active field period. The masked storage area 600 and the masked buffer area 610 start to transfer these charges line-by-line to the horizontal output register 340. The clocking signals controlling vertical transfer of charges through the masked storage area and the masked buffer area operate in unison at this stage, so that when a stored charge reaches the bottom of a column of charge-storing elements in the masked storage area 600, it is transferred to an element at the top of a corresponding column in the masked buffer area 610 and continues its vertical transfer at the same rate as that taking place in the masked storage area 600. In other words, as the masked buffer area transfers a line of stored charges to the horizontal output register 340, the masked storage area 600 supplies a further line of stored charges at the top of the masked buffer area 610.

Figure 9:
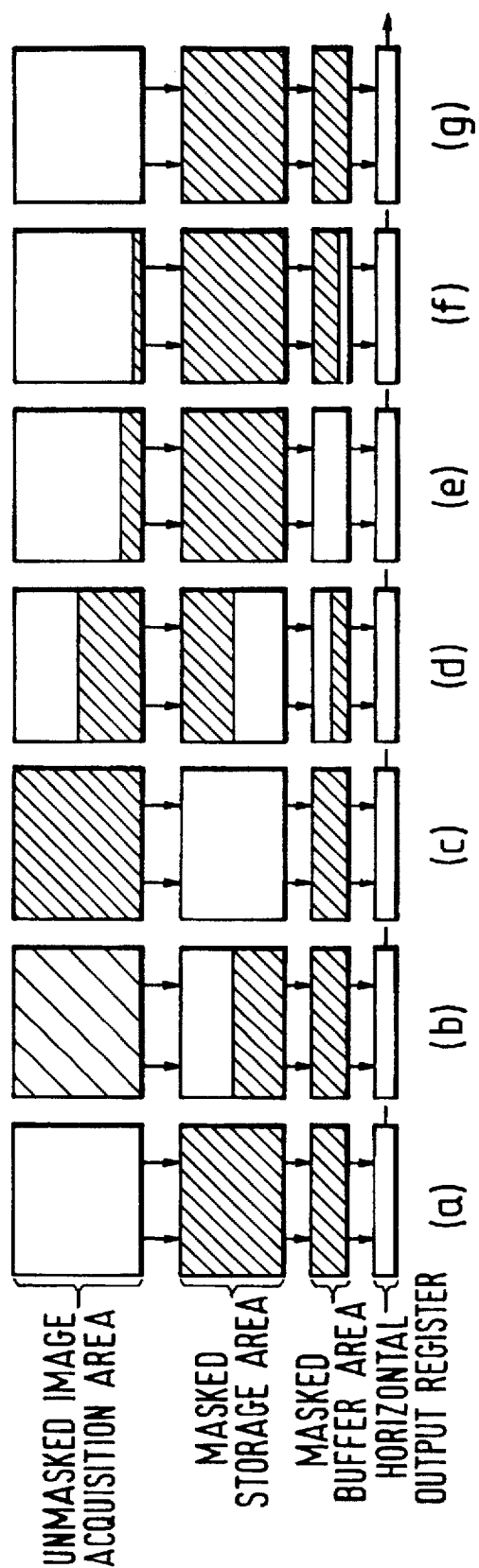
FIGS. 9(a) to 9(g) illustrate the states of the image acquisition, image storage and buffer areas of the frame transfer charge-coupled image sensor of FIG. 7 at various times during the field period shown in FIG. 8.

In contrast to the slow vertical shift through the masked storage area described above in connection with FIG. 6, the slow vertical shift from the masked storage area 600 through the masked buffer area 610 to the horizontal output register 340 shown in FIGS. 8 and 9 is at a slower rate so that at the end of the charge accumulation period in the unmasked image acquisition area 500, not all of the lines of charges will have been transferred to the horizontal output register for output.

The point (b) in the field period represents a time which is halfway through the charge accumulation period of the unmasked image acquisition area 500. This is shown schematically in FIG. 9(b) in which the unmasked image acquisition area 500 is shown lightly shaded. At this time half of the lines of charges held in the masked storage area 600 have been transferred to the masked buffer area 610 from where they are transferred to the horizontal output register 340.

The point (c) in FIG. 8 represents the end of the charge accumulation period for the unmasked image acquisition area 500. However, the point (c) is before the end of the active field period of the sensor's output video signal. In FIG. 9(c) the unmasked image acquisition area is shown heavily shaded to indicate that the charge accumulation is complete. By this stage all of the lines of charges in the masked storage area 600 have been transferred out to the masked buffer area 610. The masked buffer area 610 contains the remaining lines of charges to be transferred to the horizontal output register 340 for output. The operation of the masked storage area 600 and the masked buffer area 610 will continue separately from this stage. As shown in FIG. 8 the masked buffer area 610 continues to transfer its stored charges, line-by-line, to the horizontal output register 340 at the same rate as earlier in the field period. However, the masked storage area is now free to undergo fast vertical shift to accept lines of charges from the unmasked image acquisition area 500.

The point (d) in FIG. 8 represents a time half way through the fast vertical shift of lines of charges from the unmasked image acquisition area 500 to the masked storage area 600. At the same time a slow vertical shift of the remaining lines in the masked buffer area 610 is taking place into the horizontal output register 340. As shown in FIG. 9(d) the unmasked image acquisition area 500 is half occupied by stored charges, and the masked storage area 600 is a little more than half occupied by lines just transferred from the unmasked image acquisition area 500.

At the point (e) in FIG. 8 the last of the lines of stored charges has been transferred from the masked buffer area 610 to the horizontal output register 340. Also at this point, the masked storage area 600 is full of lines transferred from the unmasked image acquisition area 500. At the point (e) the masked storage area 600 and the masked buffer area 610 start to operate in unison once again so that the line at the bottom of the masked storage area 600 is transferred to the top of the masked buffer area 610 at the same time as a line at the bottom of the unmasked image acquisition area 500 is transferred to the top of the masked storage area 600. During this phase of the cycle the masked storage area 600 and the masked buffer area 610 are effectively operating as a single storage area again.

The point (f) in FIG. 8 represents a time towards the end of this final fast vertical shift stage. Very nearly all of the lines have been transferred out of the unmasked image acquisition area 500 into the masked storage area 600. Similarly, to make room for the lines from the unmasked image acquisition area 500, the masked buffer area 610 has been nearly filled by lines from the masked storage area 600.

At the point (g) in FIG. 8 the vertical transfer out of the unmasked image acquisition area 500 has been completed. The masked storage area 600 and the masked buffer area 610 are both full of lines of charges, and the slow vertical shift of the masked storage area and the masked buffer area in unison to supply the horizontal output register 340 can begin. This is shown schematically in FIG. 9(g), which is identical to FIG. 9(a).

A charge-coupled image sensor as described with reference to FIGS. 7 to 9 allows pixels to be transferred from the image acquisition area to the image storage area during the active field period of the output video signal of the sensor (that is, during the period in which pixel data is being slowly read out from the image storage area to provide an output video signal). In other words, considering the masked storage area 600 and the masked buffer area 610 as a composite storage area comprising first and second storage sections, pixels can be transferred from the unmasked image acquisition area into the composite storage area at a first rate, at the same time as pixels are transferred out of the composite storage area to the horizontal output register 340 at a second, different, rate. The time available for the transfer from the image acquisition area to the image storage area can therefore be increased, with a corresponding decrease in the required transfer rate. As described earlier, it is desirable to use a low transfer rate between the image acquisition area and the image storage area in order to reduce thermal and fixed pattern noise.

Figure 10:
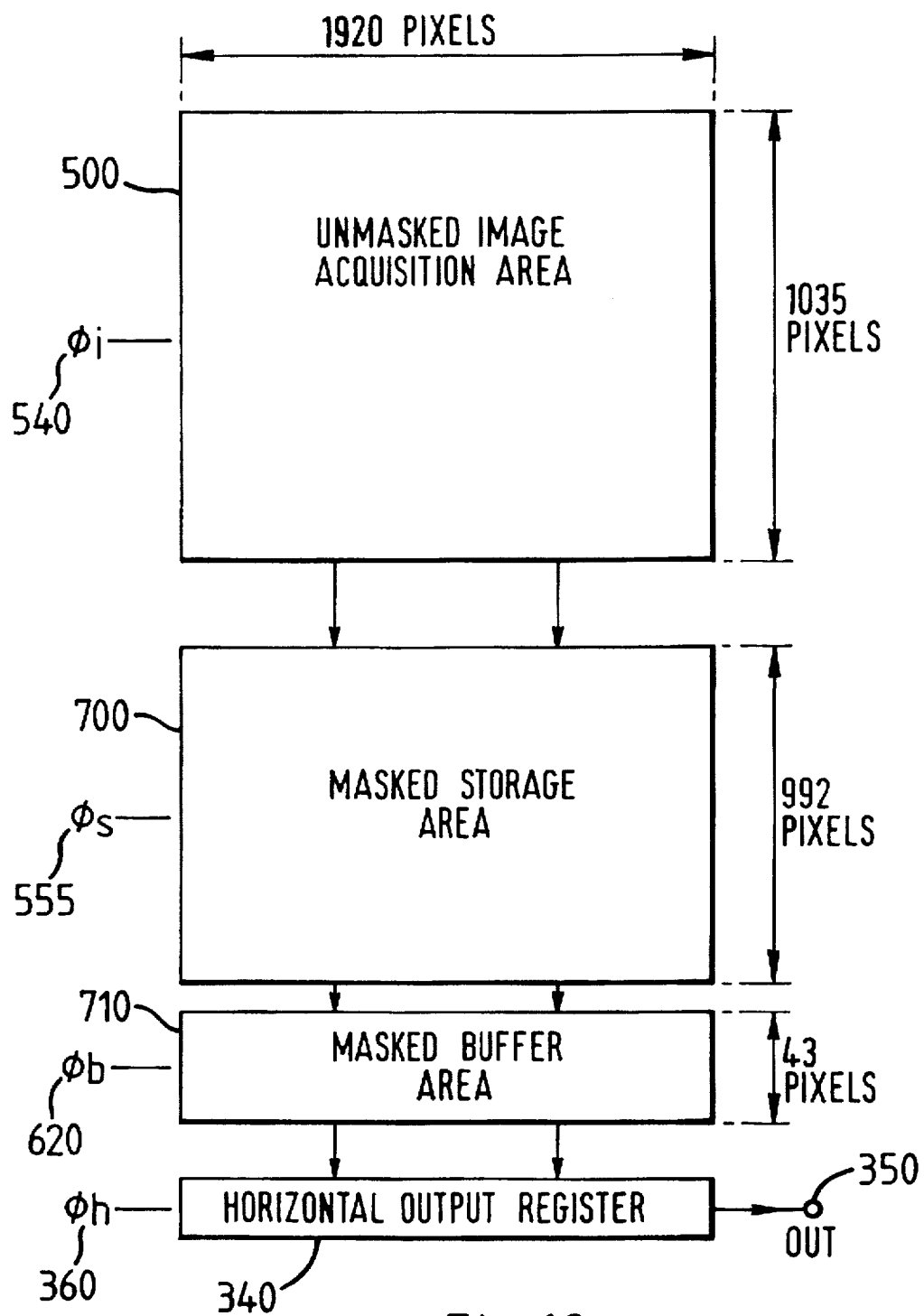
FIG. 10 schematically illustrates a frame transfer charge-coupled image sensor according to a second embodiment of the invention.

FIG. 10 shows a second embodiment of a frame transfer charge-coupled sensor which can be used to supply an output video signal having a very small field blanking period (equal to 2 line periods). Such a small field blanking period would be extremely difficult to achieve in the known charge-coupled image sensors described above in connection with FIGS. 5 and 6, because it would require a corresponding increase in the rate of fast vertical transfer from the image acquisition area to the image storage area. A reduced field blanking period may be useful to reduce the bandwidth or the digital data rate required to communicate video signals between different pieces of equipment in a studio centre, even though the full field blanking period may have to be used when the video signal is eventually transmitted or recorded.

The frame transfer sensor shown in FIG. 10 has a much smaller masked buffer area 710 than the corresponding area 610 in FIG. 7. However, the sum of the vertical pixel height of the masked storage area 700 and the masked buffer area 710 in FIG. 10 is still equal to the vertical pixel height of the unmasked image acquisition area 500.

Figure 11:
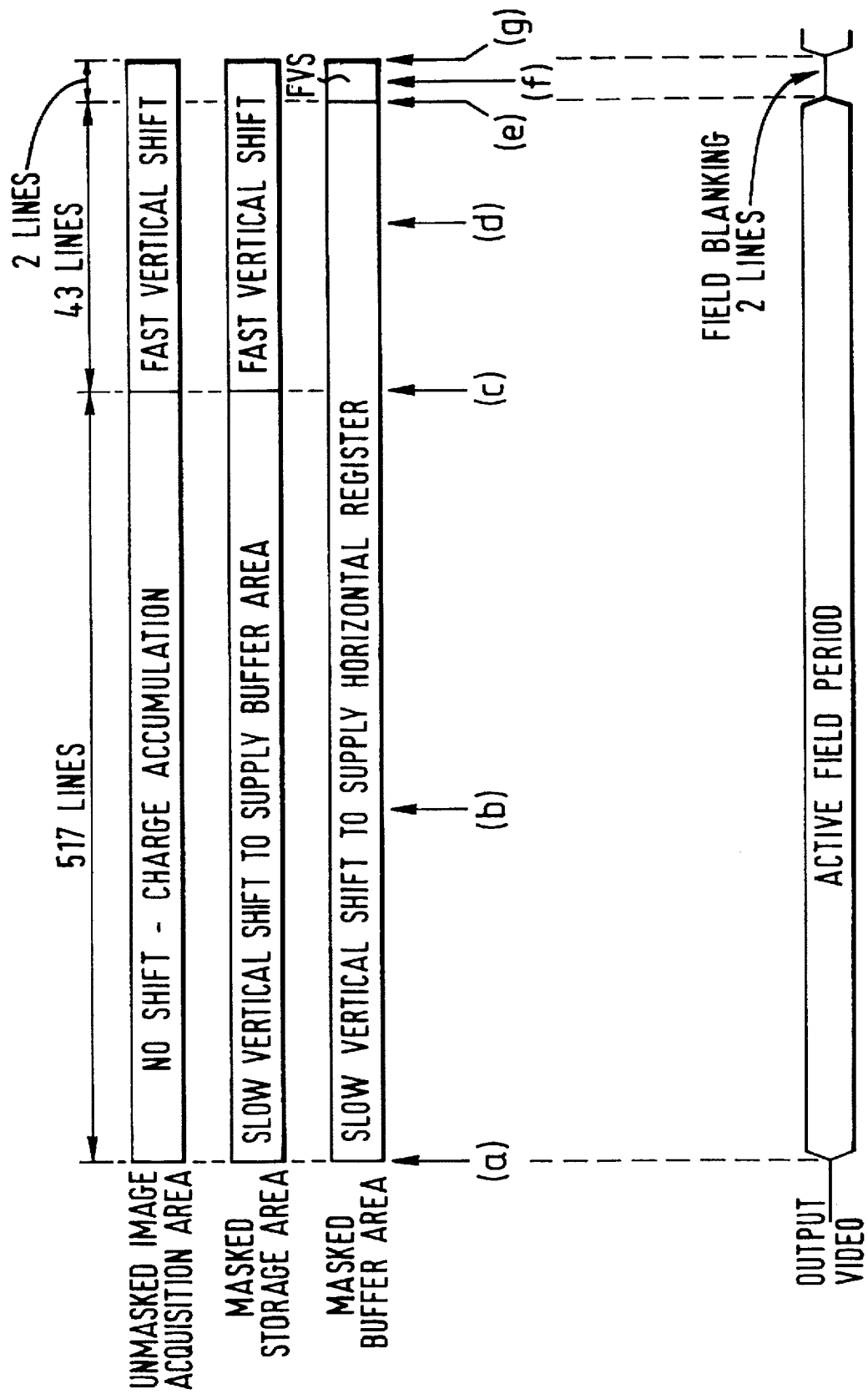
FIG. 11 is a timing diagram showing operation of the frame transfer charge-coupled image sensor of FIG. 10 during a single field period.

The operation of the frame transfer sensor shown in FIG. 10 will become clear with reference to FIG. 11, which is a timing diagram showing the operation of the frame transfer sensor of FIG. 10 during a single field period in the output video signal of the sensor. As with FIG. 8 described above, certain points along the horizontal (time) axis are marked by index letters (a) to (g). Again, as with FIG. 8, the horizontal axis is not drawn to scale. The states of the masked storage area 700, the masked buffer area 710, and the horizontal output register 340 at the points (a) to (g) are shown schematically in FIGS. 9(a) to 9(g) respectively.

The operation shown in FIG. 11 proceeds in a similar way to that shown in FIG. 8 above. The slow vertical shift from the masked storage area 700 to the masked buffer area 710 and to the horizontal output register 340 takes all but two lines of the field, finishing at the point (e) in FIG. 11. However, at the earlier point (c) all of the stored lines of pixels in the masked storage area 700 have been transferred to the masked buffer area 710, so a fast vertical shift from the unmasked image acquisition area 500 to the masked storage area 700 can begin. By the time (the point (e)) that this fast vertical shift has filled the masked storage area 700, the masked buffer area 710 has just transferred its last line of pixels to the horizontal output register 340 and so is free to receive lines of pixels from the masked storage area 700 during further fast vertical transfer.

The embodiments of the invention described with reference to FIGS. 7 to 11 both relate to frame transfer image sensors. However, it will be clear that a similar partitioned storage area could be used in other charge-coupled image sensors, such as frame-interline sensors.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A charge-coupled image sensor comprising:
   (I) an image acquisition area comprising an array of photosensitive pixel-storing elements;
   (II) an image storage area adjacent to said image acquisition area, said image storage area comprising an array of pixel-storing elements;
   (III) an output register;
   (IV) a first transfer means for transferring stored pixels from said image acquisition area to said image storage area;
   (V) a second transfer means for transferring stored pixels from said image storage area to said output register; and
   (VI) clocking means for supplying clocking signals to control said first transfer means and said second transfer means such that said first transfer means and said second transfer means are operable simultaneously at different rates of pixel transfer.

2. A charge-coupled image sensor as claimed in claim 1, in which said image storage area comprises a first storage section to which pixels can be transferred from said image acquisition area, a second storage section from which pixels can be transferred to said output register, and a third transfer means for transferring stored pixels from said first storage section to said second storage section.

3. A charge-coupled image sensor as claimed in claim 1, in which pixels stored in said output register are read out serially to form a periodic output video signal having a predefined field period, said field period comprising an active field period and a field blanking period.

4. A charge-coupled device as claimed in claim 2, in which:
   pixels stored in said output register are read out serially to form a periodic output video signal having a predefined field period, said field period comprising an active field period and a field blanking period, said field blanking period having a start;
   said second transfer means is operative to transfer pixels from said second storage section to said output register during said active field period of said output video signal;
   said first transfer means is operative to transfer pixels from said image acquisition area to said first storage section during an image transfer period which includes said field blanking period of said output video signal, said image transfer period having a start; and
   said third transfer means is operative to transfer pixels from said first storage section to said second storage section between said start of said field blanking period of said output video signal and said start of said image transfer period.

5. A charge-coupled image sensor as claimed in claim 1, in which said image acquisition area and said image storage area each comprise a plurality of lines of pixel-storing elements.

6. A charge-coupled image sensor as claimed in claim 2, in which:
   said image acquisition area and said image storage area each comprise a plurality of lines of pixel-storing elements; and
   said first, second and third transfer means are each operable to concurrently transfer a respective line of stored pixels.

7. A charge-coupled device as claimed in claim 5, in which the number of lines of pixel-storing elements in said image storage area is equal to the number of lines of photosensitive pixel-storing elements in said image acquisition area.

8. A charge-coupled device as claimed in claim 5, in which the number of pixel-storing elements in each of said plurality of lines of pixel-storing elements in said image storage area is equal to the number of photosensitive pixel-storing elements in each of said plurality of lines of pixel-storing elements in said image acquisition area.

9. A video camera comprising one or more charge-coupled image sensors as claimed in claim 1.

10. A method of operation of a charge-coupled image sensor, said charge-coupled image sensor having an image acquisition area comprising an array of photosensitive pixel-storing elements; an image storage area adjacent to said image acquisition area, said image storage area comprising an array of pixel-storing elements; and an output register; said method comprising the steps of:

(I) exposing said image acquisition area to incident light, thereby storing pixels in said image acquisition area;

(II) transferring said stored pixels from said image acquisition area to said image storage area at a first transfer rate for a first predefined period; and (III) transferring said stored pixels from said image storage area to said output register at a second transfer rate different from said first transfer rate for a second predefined period which at least partially overlaps said first predefined period.

11. A method as claimed in claim 10, further comprising the step of serially reading pixels stored in said output register to form a periodic output video signal having a predefined field period, said field period comprising an active field period and a field blanking period.

12. A method as claimed in claim 11, in which:
said first predefined period includes said field blanking period of said output video signal; and
said second predefined period is said active field period of said output video signal.

13. A method as claimed in claim 10, further comprising the step of serially reading pixels stored in said output register to form a periodic output video signal having a predetermined field period comprising an active field period and a field blanking period, said field blanking period having a start and an end;
wherein said first predefined period having a start during said active field period and having an end at said end of said field blanking period; and
wherein said second predefined period is said active field period of said output video signal.

14. A method as claimed in claim 13, wherein said first transfer rate is substantially greater than said second transfer rate.

15. A charge-coupled image sensor comprising:

(I) an image acquisition area comprising an array of photosensitive pixel-storing elements;

(II) an image storage area adjacent to said image acquisition area, said image storage area comprising an array of pixel-storing elements and further comprising a first storage section to which pixels are transferred from said image acquisition area and a second storage section from which pixels are transferred;

(III) an output register adjacent to said image storage area for receiving and storing pixels transferred from said second storage section, wherein pixels stored in said output register are read out serially to form a periodic output video signal having a predefined field period, said field period comprising an active field period and a field blanking period, said active field period having a start and an end, said field blanking period having a start and an end;

(IV) first transfer means for transferring stored pixels at a first transfer rate from said image acquisition area to said first storage section during an image transfer period having a start during said active field period and having an end at said end of said field blanking period;

(V) second transfer means for transferring stored pixels at a second transfer rate from said second storage section to said output register during said active field period of said output video signal, wherein said first transfer rate and said second transfer rate are different;

(VI) third transfer means for transferring stored pixels from said first storage section to said second storage section between said start of said field blanking period of said output video signal and said end of said field blanking period at said first transfer rate and for transferring stored pixels from said first storage section to said second storage section between said start of said active field period and said start of said image transfer period at said second transfer rate; and (VII) clocking means for supplying clocking signals to control said first transfer means, said second transfer means and said third transfer means such that said first transfer means and said second transfer means are operable simultaneously at said first transfer rate and said second transfer rate, respectively.

16. The charge coupled image sensor of claim 15, wherein said first transfer rate is substantially greater than said second transfer rate.

* * * * *

UNITED STATES PATENT AND TRADEMARK OFFICE
CERTIFICATE OF CORRECTION

PATENT NO. : 5,781,234
DATED : July 14, 1998
INVENTOR(S) : Morgan William et al.

It is certified that error appears in the above-identified patent and that said Letters Patent is hereby corrected as shown below:

On the title page, item [30], Priority Document number "49126117" should in fact be --9126117--.

Signed and Sealed this

Fifteenth Day of September, 1998

Attest:

BRUCE LEHMAN

Attesting Officer

Commissioner of Patents and Trademarks